United States Patent [19]

Carberry

[11] 4,016,551
[45] Apr. 5, 1977

[54] DYNAMIC MOS MEMORY WITH REDUCED PROPAGATION DELAY

[75] Inventor: Richard Aladine Carberry, Sunnyvale, Calif.

[73] Assignee: Data General Corporation, Southboro, Mass.

[22] Filed: Mar. 10, 1976

[21] Appl. No.: 665,478

[52] U.S. Cl. .......................... 340/173 R; 307/238; 307/279
[51] Int. Cl.² ...................................... G11C 11/40
[58] Field of Search ............... 340/173 R, 173 FF; 307/238, 279

[56] References Cited
UNITED STATES PATENTS 3,986,173  10/1976  Baitinger .................. 340/173 R

*Primary Examiner*—Terrell W. Fears
*Attorney, Agent, or Firm*—Jacob Frank; Joel Wall

[57] ABSTRACT

The present invention relates to an improved MOS memory structure. There is disclosed an array of memory cells of the three-device-per-bit type, the array being formed in rows and columns. Temporary storage cells are disclosed which are employed to receive and temporarily store inverted digital information from selected memory cells responsive to a READ signal. The inverted digital information is re-inverted upon restoration thereof into the selected memory cells, thus eliminating any need of accounting for the polarity or status of the data, whereby propagation delay time through the memory structure is reduced.

5 Claims, 5 Drawing Figures

DYNAMIC MOS MEMORY WITH REDUCED PROPAGATION DELAY

BACKGROUND OF THE INVENTION

1. Field of the Invention

The present invention relates generally to dynamic MOS memories and, in particular, to circuit structure for data retention in dynamic MOS memories having reduced propagation delay. 2. Description of the Prior Art In data processing or computer systems the memory function is an essential part of the overall processing or computing operation. Data which is stored in a memory is in the form of some physically measurable quantity. Memories can be constructed from almost any structure which has the characteristic of retaining a physically measurable quantity. For example, if magnetic cores are used to fabricate a memory, then data is permanently retained as or by magnetic flux in each core, one flux direction representing a binary "zero" and the other flux direction representing a binary "one". For another example, in metal oxide semiconductor (MOS) memories, the data is in the form of a voltage (e.g.: a 1) or lack thereof (e.g.: a 0) which is temporarily retained on capacitance intrinsic to the MOS circuit; that is, because the circuit is constructed on a substrate or base from semiconductor materials which overlap each other (to form various circuit components such as transistors, gates, and other elements), there is inherent or intrinsic or parasitic capacitance between the various layers of semiconductor material forming these circuit elements. It is this very capacitance which is utilized in, and essential to the operation of, dynamic MOS memories. "Dynamic" is synonymous with "temporary" since capacitors continuously leak or discharge the voltages applied to them; these voltages must be replaced or refreshed periodically in order to retain the data represented by these voltages in the memory.

Examples of prior art MOS type memories are disclosed in U.S. Pat. Nos. 3,760,378 and 3,774,176; these memories can be arranged in arrays of individual memory cells. Prior art cells may contain three MOS field effect transistors (or MOSFET's) per cell, and these kinds of cells are usually referred to as three-device-per-bit cells. The array takes on an orthogonal character having rows (X direction) and columns (Y direction) that are mutually perpendicular or orthogonal. The rows are conventionally connected to X oriented precharge leads and the columns are usually connected to Y oriented control leads. The signals supplied on these leads are obtained indirectly, the leads themselves being usually integrally formed on the substrate.

The row or X oriented pre-charge leads (or busses) are signal leads which are logically operated upon to provide an output from the memory. The Y oriented control or column leads (or busses) are also logically operated upon and are normally used for providing READ and WRITE control signals to memory cells of the selected column, for reading information stored in a memory cell and for writing information onto the same cell. In addition, as noted with regard to MOS structure, the memory circuitry must provide for recirculation (refreshing) or restoration of data onto the temporary storage capacitance referred to above.

The conventional or prior art refresh method in three-device-per-bit MOS memories is to READ the data from a column of memory cells onto respective ROW BUSSES and then WRITE the inverted data back into the cells (by pulsing WRITE lead). Since a double inversion does not take place for each READ/WRITE cycle, then some columns end up with memory cells having inverted data and others do not. The polarity or status of the cell data must be kept track of by some means such as a status cell (counter) in each column. Each time the data in a column is read, its cell changes polarity. The status cell for a particular column must then be exclusive ORed with the data from the selected memory cell of that column to determine polarity. The primary disadvantage to this prior art approach is that the exclusive OR gate adds considerable propagation delay or increases READ access time.

The present invention is a improvement over the prior art memories since memories constructed in accordance with the principles of the present invention eliminate the need for an exclusive OR gate, which would otherwise be located in the path of data propagation and increase propagation delay time.

SUMMARY OF THE INVENTION

The present invention relates to improved dynamic MOS memory structure comprising a supporting base or planar substrate, an array of memory cells uniformly distributed across said substrate, means for writing digital information int and reading digital information out from selected memory cells, means for inverting the polarity or status of the digital information read out and temporarily storing the inverted information at the time of the reading out thereof, means for selecting one bit of digital information read out for the outputting thereof, and means for re-inverting all temporarily stored and inverted digital information at the time of the re-writing thereof back into the respective selected memory cells.

The present invention further relates to dynamic MOS memory structure comprising a planar substrate, a first plurality of MOS memory cells arranged in rows and columns, means for selecting one of the columns, means for writing digital information into the memory cells located in the selected column, means for simultaneously inverting and reading digital information from all memory cells in the selected column, means for temporarily storing each bit of digital information inverted and read, means for selecting one of the memory cells in the selected column and for controlling the digital information from that selected cell to be output, and refresh means for re-inverting the digital information temporarily stored in the row inverter means and for restoring this information into respective memory cells located in the selected column.

A further feature of the present invention employs memory cells that are three-device-per-bit cells.

Since digital information which is stored in memory cells in a selected column is inverted and temporarily stored when that selected column is subjected to the READ command, and since inverted and temporarily stored digital information is further re-inverted when re-inserted into the selected memory cells the prior art requirement of keeping track of inversions and re-inversions is eliminated; the data is always re-inserted back into the memory cells in a particular column with the same status or polarity it had originally. Accordingly, a status cell (a counter) is not required in each column to determine status of the data, and a exclusive OR gate (otherwise needed in the prior art to process information in the status cells) is eliminated, thereby reducing delay propagation time in the memory. Thus, an advantage of the present invention is that propagation delay time is reduced.

A further advantage of the present invention is that the reduction in propagation delay time through the memory provides a concomitant increase in overall operating speed of a data processing system which incorporates the memory of the present invention.

It is thus an object of the present invention to provide an improved dynamic MOS memory structure;

It is further object of the present invention to provide an MOS memory structure having reduced propagation delay time;

It is yet a further object of the present invention to provide an MOS dynamic memory where digital data is always re-inserted or refreshed into the dynamic memory cells with the same status or polarity that it had when it was written in previously.

Further objects and advantages of the present invention will become apparent to those of ordinary skill in the art after referring to the detailed description of the preferred embodiments of the present invention and to the appended drawings in which:

DESCRIPTION OF THE PREFERRED EMBODIMENTS

Figure 1:
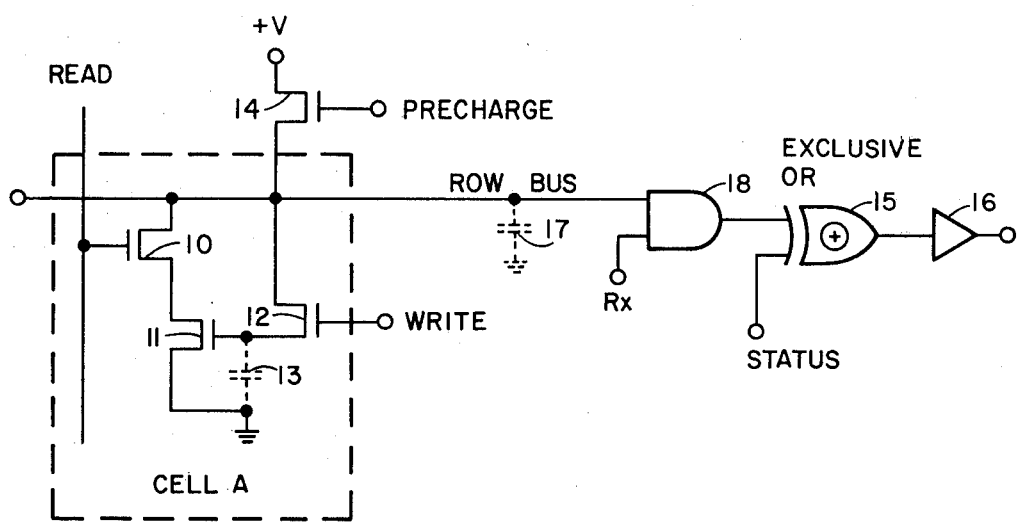
FIG. 1 is a circuit diagram of an MOS memory cell as employed in the prior art.
Figure 2:
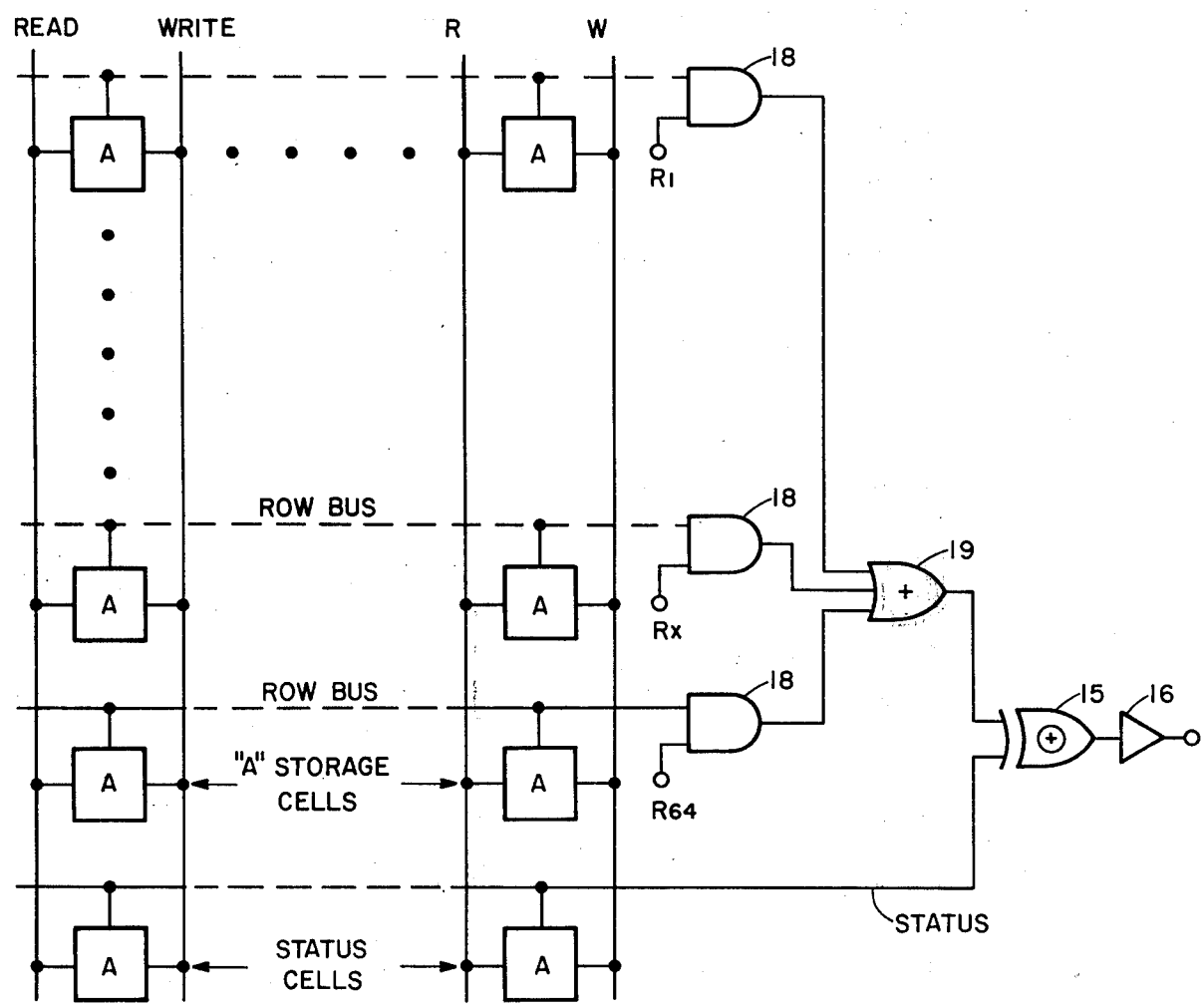
FIG. 2 is an illustration of a prior art array of dynamic MOS memory cells.

Referring to FIG. 1 and FIG. 2, prior art structure is shown. Memory cell A in FIG. 1 is shown in an array form in FIG. 2. Memory cell A includes three FET (field effect transistor) switches. The drain of FET 10 is connected to an X oriented conductor designated ROW BUS. The source of FET 10 is connected to the drain of FET 11, the source of which is connected to ground. Also, the drain of FET 12 is connected to ROW BUS, the source of which is connected to the gate of FET 11 and to one side of intrinsic capacitance 13, (the dashed line presentation of capacitor 13 is intended to indicate its parasitic or intrinsic nature). The other side of the capacitor is grounded. Also connected to ROW BUS is the source of PRECHARGE FET 14, the drain of FET 14 being connected to positive supply voltage, +V. The gate of FET 10 is connected to READ bus, the gate of FET 12 is connected to WRITE bus, and the gate of FET 14 is connected to the PRECHARGE bus.

Still referring to FIG. 1, parasitic capacitance 17 is shown to be connected between ROW BUS and ground. ROW BUS feeds one input of AND gate 18, the other input lead being a Rx control lead. The output of AND gate 18 feeds one input of exclusive OR gate 15, the other input being a STATUS control lead connected to the status cells mentioned earlier. The output of the exclusive OR gate is buffered by output buffer 16 and conducted to circuitry connected from the output of the memory.

Figure 5:
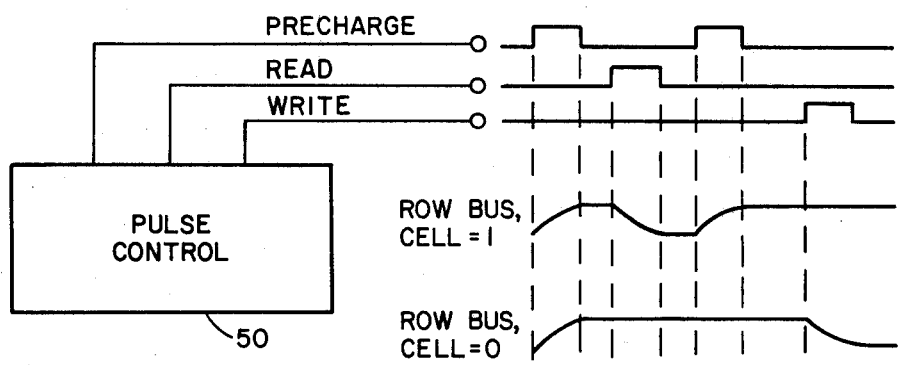
FIG. 5 is a illustration of control wave forms associated with operation of the present invention.

Considering the prior art operation, data is stored as a 1 or 0 on capacitor 13. The READ and WRITE signals shown in FIG. 5, are common to a Y oriented column of cells. Although only one cell of a column as shown in FIG. 2 is desired to be written into, FET 12's turn on for each cell in the column. Thus, data in unselected cells in that column must have previously been conducted onto respective ROW BUSSES (on capacitors 17) to be recirculated back into capacitors 13 when FET's 12 turn on responsive to the WRITE command. (As shown in FIG. 2, there is a separate ROW BUS for each cell in the column).

Assume a 1 (high) is stored on capacitor 13 in FIG. 1 in a cell, located in a column which is subjected to a WRITE COMMAND, but which is not intended to be written into. This 1 is transferred to capacitor 17 as a 0 (low) for the following reasons. First, ROW BUS (capacitor 17) is precharged by closure of FET 14 switch responsive to PRECHARGE control; then a READ pulse causes FET 10 to conduct and since FET 11 has positive voltage on its gate (1 on capacitor 13). FET 11 conducts and the ROW BUS is dropped towards ground potential. This low is stored on capacitor 17. If the WRITE pulse then is applied to the gate of FET 12 then the 0 (low) stored on capacitor 17 is transferred back into the memory cell on capacitor 13. Thus, it can be seen that in the prior art, there is an inversion of data every time this sequence is followed and the status cells (merely counters) of FIG. 2 are required in the prior art to keep track of the data changes.

Similarly, if a 0 is stored on capacitor 13 in FIG. 1 in a cell located in a column which is subjected to a WRITE command, but which is not intended to be written into, this 0 (low) is transferred to capacitor 17 as a 1 (high) for the following reasons. First, ROW BUS is precharged by application of a PRECHARGE pulse to the gate of FET 14. Then a READ pulse is applied to the gate of FET 10. Since low voltage is on the gate of FET 11, FET 10 and FET 11 do not conduct and ROW BUS stays high. Then, when a WRITE pulse is applied to the gate of FET 12, (whether or not another PRECHARGE pulse is applied to the gate of FET 14) the high on capacitor 17 is transferred to capacitor 13, which previously stored a low. Thus, once again it can be seen that in the prior art there is an inversion of data stored in the memory cells each time this sequence is followed, and some means for keeping track of the inversions is required. The prior art requirement of status cells (inversion counters) necessarily dictates the requirement of exclusive OR gate 15; if both inputs to gate 15 are the same, there is no output therefrom and in this manner the inversions of data on a column-by-column basis are accounted for. Gate 15 imposes a propagation delay, and thus slows down overall memory operation.

Figure 3:
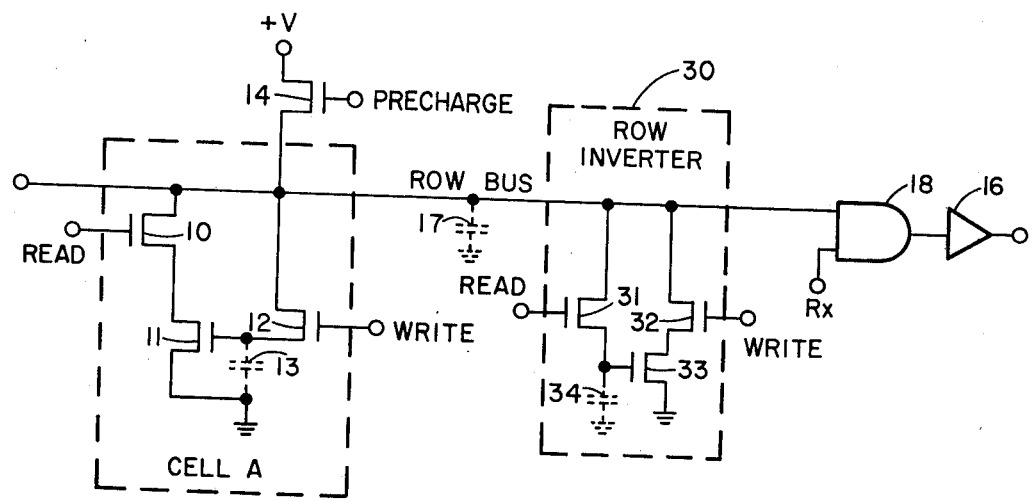
FIG. 3 is a first illustrative embodiment of the present invention.
Figure 4:
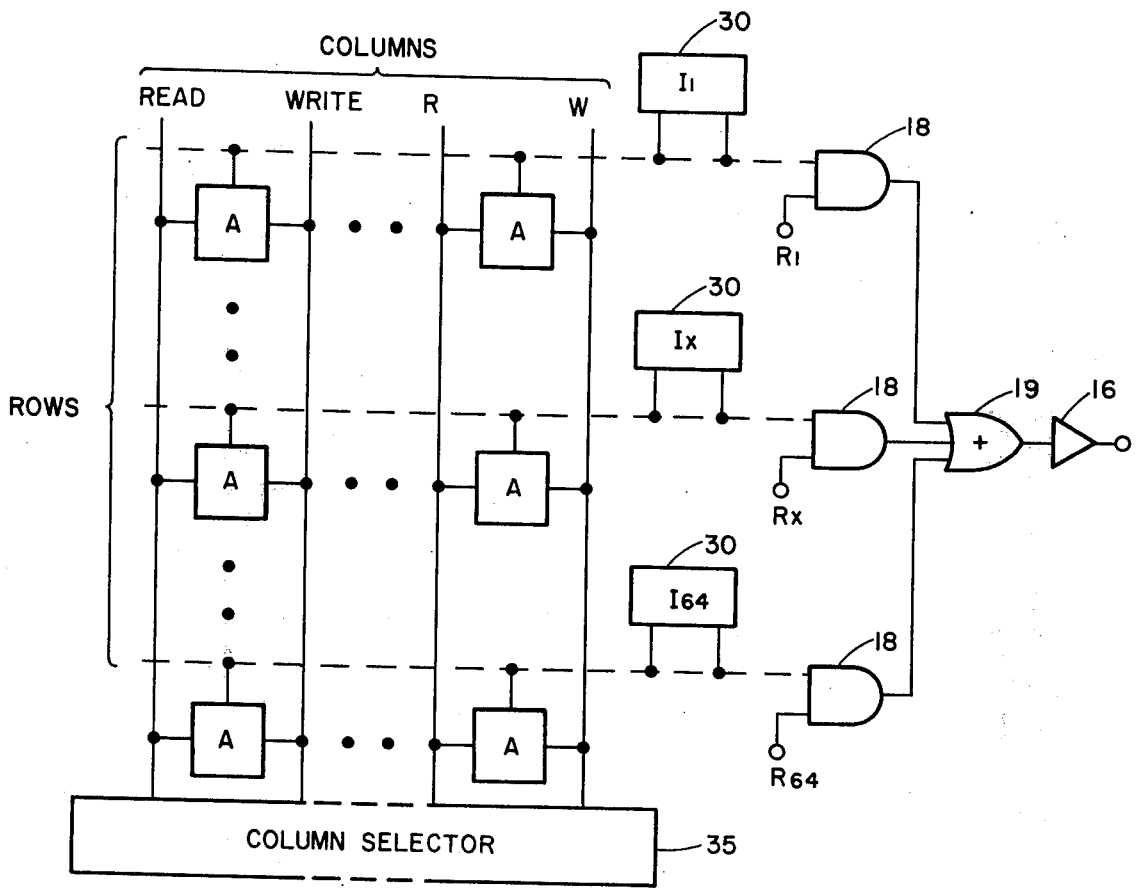
FIG. 4 is a second illustrative embodiment of the present invention.

By contrast with the above-described prior art operation, referring to FIGS. 3, 4, and 5, row inverter 30 is inserted in the ROW BUS line in place of gate 15. Row inverter 30 includes MOSFET's 31, 32 and 33. Intrinsic capacitance 34 is shown and stores temporarily the data transferred from CELL A, to be described below. The drains of FET's 31 and 32 are connected to ROW BUS. The source of FET 32 is connected to the drain of FET 33, the source of which is grounded. The source of FET 31 is connected to the gate of FET 33, and to one end of intrinsic capacitance 34, the other end of the capacitor being grounded.

In operation, assume that a 1 is stored on capacitor 13. The pulse sequence is as depicted in FIG. 5. First ROW BUS is precharged; then READ pulse appears, and FET 10 and FET 11 conduct bringing ROW BUS towards ground, thus inserting this 0 or low on capacitor 34 via conducting FET 31, (the READ pulse is simultaneously applied to the gate of FET 31). A low or a 0 is thus temporarily stored on capacitor 34. Another PRECHARGE pulse makes ROW BUS high. The succeeding WRITE pulse, applied to both FET 12 and FET 32 simultaneously, does not cause conduction through FET 32 and FET 33 since the gate voltage of FET 33 is low and FET 33 will not conduct. But the WRITE pulse applied to the gate of FET 12 permits the recharging of capacitor 13, and thus re-inserts a 1 into memory cell A, which was stored there originally. The present invention thus employs this double inversion technique to maintain in proper orientation or polarity, the digital information in the memory cells without requiring status tracking, and therefore eliminates the delay-producing gate 15.

There is an over-ride control (not shown) connected to capacitor 34 which overrides the data on capacitor 34 to permit insertion of new data into memory cell A via the row inverter. Lack of illustration of this feature does not detract from understanding of the present invention, and is not shown for purposes of improving clarity of illustration of the present invention.

FIG. 4 shows a schematic diagram of the present invention as employed in an array of substantially orthogonal rows and columns. (The usage of dashed lines therein is intended to imply that the diagram not limit the number of memory cells to any particular number.) The MOS transistors and gates are actually supported by a substrate or base that lies essentially in a plane, or is planar; in other words, a planar substrate supports an array of a first plurality of memory cells arranged in a second plurality of rows substantially orthogonal or perpendicular to a third plurality of columns. In a particular embodiment of the present invention, the rows and columns are equal in number and comprise 64 each.

FIG. 4 shows AND gates 18 which control the row selection for outputting an inverted bit of digital information from the memory cell. OR gate 19 passes the selected ROW's information to buffer 16, wich in turn provides the information to the remaining part of the data processing system. Column selector 35 comprises a group of AND gates used to control the application of the READ and WRITE waveforms of FIG. 5 to a particular or selected one of the columns of memory cells A.

FIG. 5 depicts pulse control unit 50, which supplies PRECHARGE, READ, and WRITE pulses in the sequence shown. The voltage response of a pre-charged ROW BUS is also shown for 1 and 0 storage.

FIG. 2 shows the prior art delay-producing exclusive OR gate 15 and status cells connected therewith by the STATUS line. Of course, FIG. 4 does not show gate 15 or status cells.

The invention may be embodied in yet other specific forms without departing from the spirit or essential characteristics thereof. Thus, the present embodiments are to be considered in all respects as illustrative and not restrictive the scope of the invention being indicated by the appended claims rather than by the foregoing description, and all changes which come within the meaning and range of equivalency of the claims are therefore intended to be embraced therein.

What is claimed is:

1. A dynamic MOS memory structure comprising:
   a planar substrate;
   a first plurality of conductively interconnected MOS memory cells, each of said cells being capable of temporarily storing one bit of digital information, said first plurality being arranged in a substantially orthogonal second plurality of rows and third plurality of columns on said planar substrate;
   first selecting means for selecting one of said third plurality of columns;
   means for writing said digital information into a second plurality of said interconnected memory cells located in said one of said third plurality of columns;
   means for simultaneously inverting and reading said digital information from said second plurality of said interconnected memory cells;
   a second plurality of row inverter means, each being conductively connected in each of said second plurality of rows respectively to a third plurality of said interconnected memory cells located in said each of said rows and responsive to operation of said inverting and reading means for temporarily storing said inverted digital information;
   second selecting means for selecting one of said second plurality of rows and for controlling the outputting of an inverted one bit of information from said one of said memory cells common to both the selected one of said second plurality of rows and the selected one of said third plurality of columns; and
   refresh means for re-inverting each bit of said inverted digital information temporarily stored in each of said second plurality of row inverter means respectively, and for restoring said each bit of said digital information into a respective one of said memory cells located in said one of said third plurality of columns.

2. A structure as recited in claim 1 wherein each of said memory cells is a three-device-per-bit cell.

3. A structure as recited in claim 1 and wherein said second and third pluralities are each equal to sixty-four.

4. A structure as recited in claim 1 further including pre-charge means for charging selected ones of said second plurality of rows of said memory cells.

5. A dynamic MOS memory structure comprising:
   a planar substrate;
   a uniformly-spaced memory cell array supported by said substrate;
   said array being formed by a plurality of conductively interconnected MOS memory cels for storing a like plurality of bits of digital information;
   means for simultaneously inverting and reading said digital information from certain selected ones of said memory cells;
   means for temporarily storing said inverted digital information;
   means for enabling the outputting from said structure of said inverted digital information from one of said certain selected memory cells; and
   means for re-inverting said temporarily-stored inverted digital information into respective said certain selected ones of said memory cells.

* * * * *